(12) United States Patent
Groenhuis et al.

(10) Patent No.: US 8,508,035 B2
(45) Date of Patent: Aug. 13, 2013

(54) CIRCUIT CONNECTOR APPARATUS AND METHOD THEREFOR

(75) Inventors: Roelf Anco Jacob Groenhuis, Nÿmegen (NL); Sven Walczyk, Waalve (NL); Emiel Bruin, Elst (NL); Rolf Brenner, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/309,878

(22) Filed: Dec. 2, 2011

(65) Prior Publication Data

US 2013/0140705 A1 Jun. 6, 2013

(51) Int. Cl.
*H01L 23/48* (2006.01)
*H01L 21/00* (2006.01)

(52) U.S. Cl.
USPC .......................................... 257/693; 438/127

(58) Field of Classification Search
CPC ........... H01L 2924/01078; H01L 2924/01079; H01L 2924/14; H01L 2224/16; H01L 2224/48091

USPC ................ 257/666, 690, 693; 438/106, 110, 438/127

See application file for complete search history.

(56) References Cited

U.S. PATENT DOCUMENTS 7,233,198 B2 * 6/2007 Niederkorn ........................ 330/9
2011/0198738 A1 * 8/2011 Van De Water et al. ...... 257/666

FOREIGN PATENT DOCUMENTS

WO   WO 2010/046825   *   4/2010

* cited by examiner

*Primary Examiner* — Nikolay Yushin

(57) ABSTRACT

Aspects of the present invention are directed to circuits, circuit packages and related methods. In accordance with various example embodiments, respective electrodes are implemented to facilitate contact to a semiconductor device via different surfaces and/or sidewalls, as may be useful in connecting the device to an external package having a plurality of semiconductor devices in which same-surface connections to the devices are spatially restricted. The semiconductor device has opposing surfaces and sidewalls connecting the surfaces, and contacts to respective different regions in the device. Respective electrodes are coupled to the respective contacts and extend along/around the device to provide access to the contacts via different surfaces.

15 Claims, 15 Drawing Sheets

CIRCUIT CONNECTOR APPARATUS AND METHOD THEREFOR

Aspects of various embodiments of the present invention are directed to circuits, and in particular to circuits employed in integrated circuit packages.

Many circuits, circuit apparatuses and integrated circuit packages are being used in applications that require high performance yet small size. For example, portable hand-held devices benefit from integrated circuitry that is very small, light weight and compact. Other devices such as those used in the automotive industry, computing industry and various circuit-based products can similarly benefit from miniaturization.

When the package size of a circuit such as an integrated circuit is reduced, the footprint of the component is reduced as well. Integrated circuits often employ I/O contacts on a surface of a wafer for connecting the wafer to other components, such as to other circuits. The formation of such devices has often involved manufacturing processes such as solder print and solder screen/stencil processes, which can be limited in their ability to space contacts relative to one another. Other approaches that may involve more precise spacing may be expensive or difficult to implement. Moreover, while some circuit components can be manufactured with smaller contact spacing (e.g., lateral diodes or transistors), other circuit components cannot, which may require that those components for which contact spacing could be smaller must still maintain a larger spacing for compatibility.

These and other matters have presented challenges to the design and implementation of circuits and circuit packages for a variety of applications.

Various example embodiments are directed to circuits and their implementation.

In connection with various embodiments, a circuit apparatus includes multiple-side contacts for a semiconductor device having respective contacts to which same-surface contact is less accessible than contact via different surfaces. Isolation regions are employed adjacent solder contacts on sidewalls and surfaces of a semiconductor device, to mitigate contact of the solder and substrate and therein mitigate leakage current and/or shorts between soldered contacts and/or surfaces. Electrodes extend around the isolation regions, respectively making electrical contact to different portions of the device, via different sides of the circuit apparatus.

According to another example embodiment, electrodes facilitate contact to different regions in a semiconductor device, for use in connecting to an external package having a plurality of semiconductor devices in which same-surface connections to the devices are spatially restricted. The semiconductor device has first and second opposing surfaces and opposing sidewalls connecting the opposing surfaces, including first and second (and further) sidewalls forming a three-dimensional structure. The device also includes first and second different regions and first and second conductive contacts respectively in contact with the first and second different regions, with the contacts being less accessible via a common surface than via different surfaces. A first electrode connects with the first contact and extends along the first surface and along at least one of the sidewalls. A second electrode connects with the second contact and extends along at least one of the surfaces and one of the sidewalls that is different than the sidewall along which the first electrode extends. Isolating material having an opening therein exposes the first conductive contact at the first surface. The first electrode extends through the opening to contact the first conductive contact. The isolating material electrically insulates the first and second electrodes from one another and from the first surface and the opposing sidewalls.

More particular example embodiments are directed to an apparatus in which first and second contacts near a common surface of a semiconductor device are respectively connected to electrodes that extend along external surfaces of the device and provide access to the contacts via different surfaces. In some instances, access to a first contact is made at a first surface, and access to a second contact is made via an opposite surface. Isolating material electrically isolates the electrodes from one another and from the semiconductor device (e.g., from doped regions bounded by the sidewalls and surfaces).

Another example embodiment is directed to a method for manufacturing a semiconductor device, for connection to an external package having a plurality of semiconductor devices in which external connections to the devices are spatially restricted. Isolating material is formed on sidewalls and on a first surface of a semiconductor device, the device also having a second surface opposing the first surface and first and second opposing sidewalls extending between the opposing surfaces. The isolating material has an opening that exposes a first conductive contact in the first surface and in contact with a first different region in the device. A first electrode is formed on portions of the isolating material that are on the first surface and on at least one of the sidewalls, and extending through the opening and in contact with the first contact. A second electrode is formed in electrical contact with a second different region via a second contact, extending along one of the sidewalls that is different than a sidewall along which the first electrode extends, therein providing access to the first and second contacts via different external connectors adjacent different sidewalls or surfaces.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
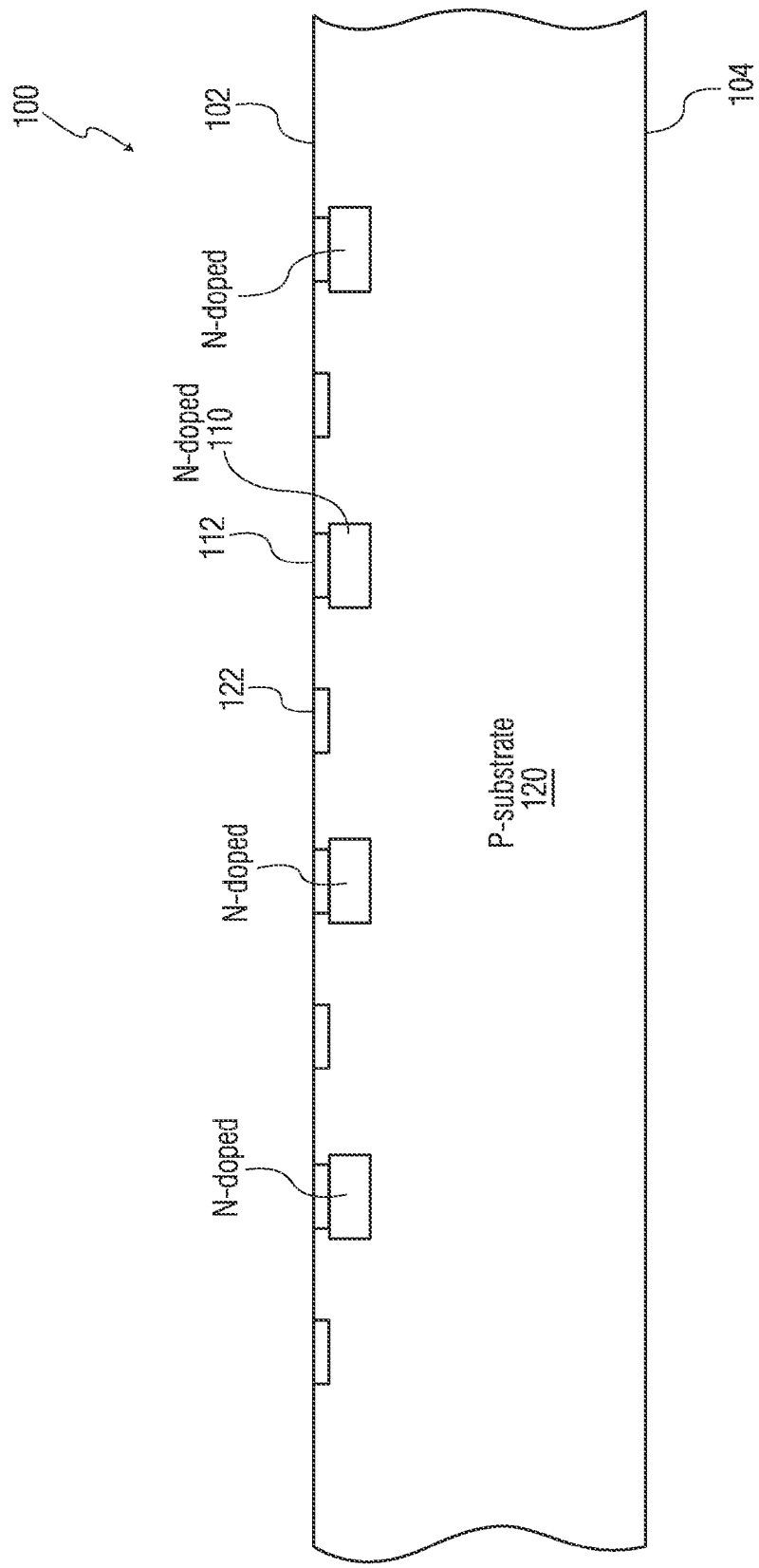
FIG. 1 shows a semiconductor wafer at a stage of manufacture, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. In addition, the term "example" as used throughout this application is only by way of illustration, and not limitation.

Aspects of the present invention are believed to be applicable to a variety of different types of circuits, devices, systems and arrangements, including those involving small circuit package sizes. While the present invention is not necessarily so limited, various aspects of the invention may be appreciated through a discussion of examples using this context.

Various example embodiments are directed to circuits and/or circuit packages having input/output (I/O) contacts on multiple sides/surfaces, and to the fabrication of such circuits and packages. Various specific embodiments are directed to semiconductor packages having small sizes as facilitated by the placement of contacts on sidewalls of the package, in addition to and/or as an alternative to the placement of contacts on upper or lower surfaces of the package. Such embodiments may be implemented to realize packages having sizes in the range of about 0.4 mm×0.2 mm×0.2 mm. These approaches can be used, for example, to achieve package sizes otherwise unattainable using top-side contacts, which can limit miniaturization due to contacts spacing/pitch requirements, addressing various challenges such as those described above.

In certain implementations, a circuit and/or package as discussed herein further includes isolating layers (e.g., electrically insulating layers) in combination with plated components, which can be implemented in manufacturing techniques to achieve/reduce the package size. For example, isolating layers and I/O connections are formed on top and side surfaces of semiconductor packages, with the isolation being configured to permit contact to the I/O connections for connecting circuitry to the package. In some implementations, a semiconductor package as discussed herein is assembled on a circuit board using pick and place type equipment, laid out for passive surface mount devices. In addition, one or more of the various approaches as discussed herein may be implemented with semiconductor devices having multiple contacts (e.g., two to four I/O contacts), which can be located on one or more of the top, bottom and side surfaces of a semiconductor device and/or device package as discussed herein.

In connection with various embodiments, a vertically-oriented circuit package includes multiple-side contacts. Isolation regions are employed adjacent solder contacts on sidewalls, to mitigate contact of the solder and substrate and therein mitigate leakage current between soldered contacts and/or surfaces. In some implementations, a structured isolating layer is formed on an active side of a wafer, and an isolating layer is formed on at least part of the sides of the wafer, with an opening in the isolation facilitating contact with I/O connections in the wafer. A conductive plating base is applied to ends of the device with I/O surfaces, with the device ends becoming I/O contacts for the internal circuit. A solderable layer may be formed on the plating base to facilitate soldering of the device to a printed circuit board or other component, which can be effected using common surface mount technologies.

More particular example embodiments are directed to a circuit apparatus that is amenable to external electrical contact via different sides thereof, and facilitates connection to external connectors in an environment in which same-surface connections are spatially restricted and less-accessible, relative to different-surface connections. The apparatus includes a semiconductor device (e.g., a silicon material) having opposing surfaces and opposing sidewalls connecting the opposing surfaces, in which contacts to different regions (e.g., doped regions) are less accessible via a common surface than via different surfaces. First and second electrodes respectively contact the different regions, and extend along outer surfaces/sidewalls of the apparatus to facilitate external connection to each region via the different surfaces/sidewalls, therein mitigating issues relating to the formation of same-surface contacts such as those discussed in the background above. Isolating material electrically isolates the respective electrodes from one another, and further isolates the electrodes from the device (e.g., isolates the electrodes from contacting or influencing doped regions in the device, with connection limited to the contacts in the device).

The second electrode may provide access to a contact at or in the same surface as the contact to which the first electrode is connected, or to contacts at opposing surfaces of the semiconductor device. In some instances, the second contact is in the second surface and the second electrode is in direct contact with the second surface, with the first and second electrodes respectively providing contact to the first and second different regions via external connectors adjacent the first and second surfaces.

Accordingly, various implementations are directed to a circuit apparatus having first and second electrodes that extend and provide electrical connections to different contacts within a semiconductor device via external connectors adjacent different surfaces or sidewalls of the semiconductor device. Isolating material electrically isolates the first and second electrodes respectively from all portions of the semiconductor device except the contact that the electrode physically contacts. In this context, contact can be readily made to various portions of surfaces/sidewalls of the circuit apparatus, mitigating the need for same-size contacts and the related issues pertaining to spacing between contacts (e.g., as may be limited by soldering or other contact processes).

In various embodiments, electrodes as discussed herein are coated with solder layers that are respectively separated/insulated from one another. These solder layers render the device amenable to contact via two or more different external surfaces while ensuring that the solder does not migrate and electrically connect the electrodes or other portions of the device upon heating.

Other embodiments are directed to methods for manufacturing a semiconductor device, for connecting the device to an external package having a plurality of semiconductor devices in which external connections to the devices are spatially restricted (e.g., as discussed above). Isolating material is formed on external surfaces/sidewalls of the device, with one or more openings therein made to provide access to the device. The external sidewalls and surfaces are coated with electrodes that respectively couple to different regions in the device, and that are further electrically isolated from one another and portions of the device other than the contacts (e.g., sidewalls of the device). Further embodiments are directed to coating the electrodes with a solder material, to facilitate solder contact to external connections. Still further embodiments are directed to connecting the electrodes to external connections via different surfaces of a device, using the solder, and to doing so in a package having a multitude of such circuit components.

Figure 9:
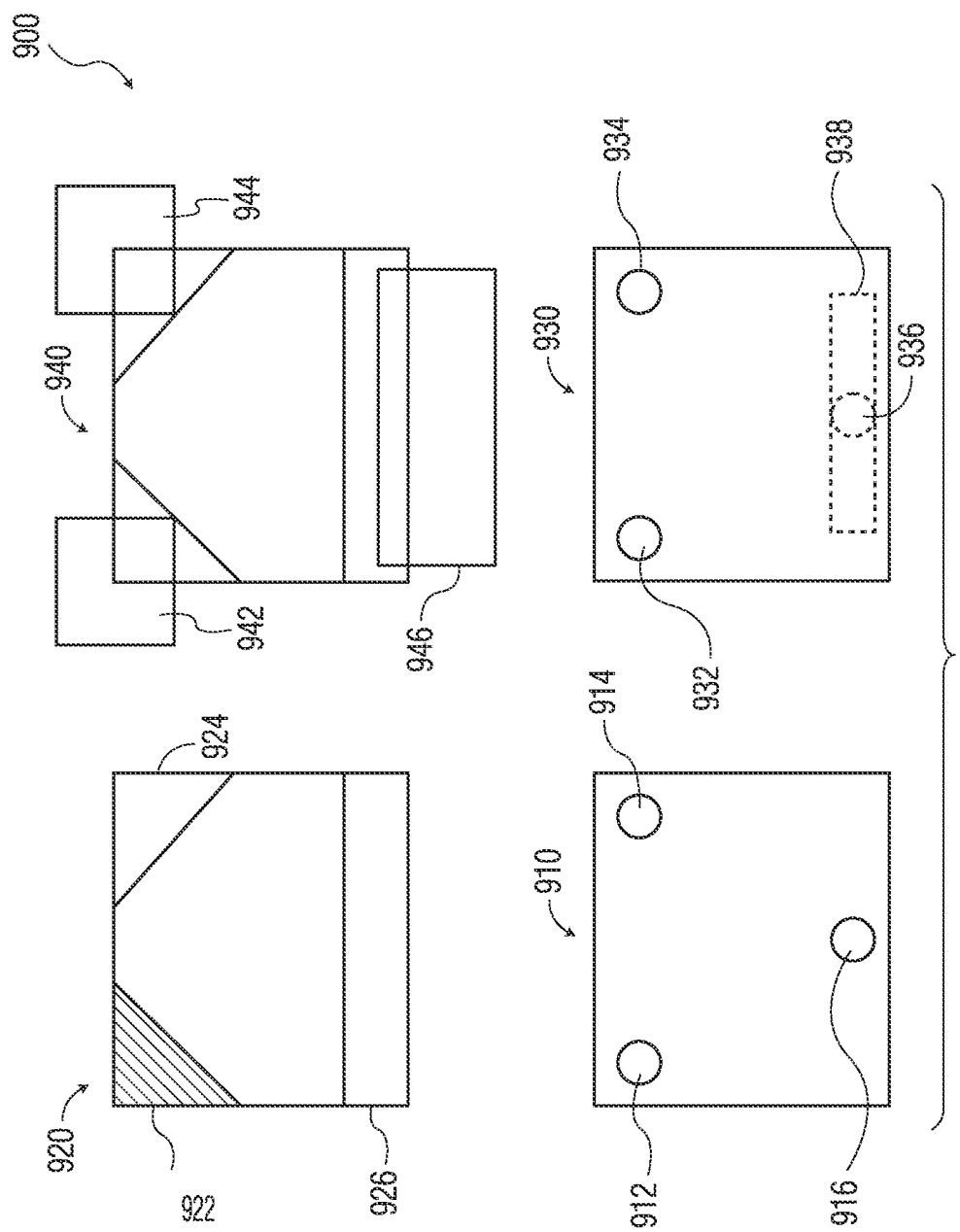
FIG. 9 shows top and bottom views of a semiconductor device having multiple I/O contacts and a corresponding printed circuit board layout, in accordance with another example embodiment of the present invention.
Figure 10:
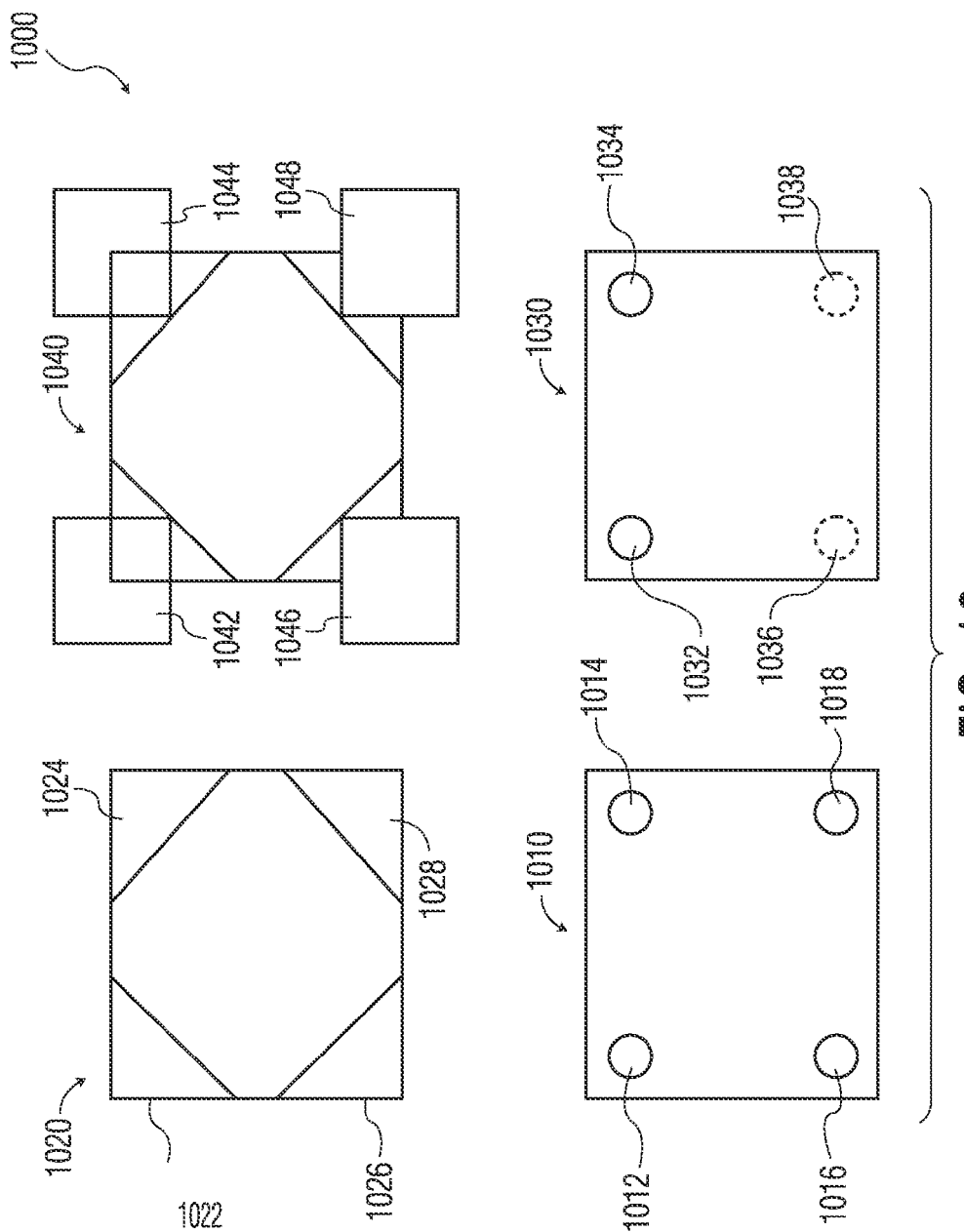
FIG. 10 shows top and bottom views of a semiconductor device having multiple I/O contacts and a corresponding printed circuit board layout, in accordance with another example embodiment of the present invention.

Turning now to the Figures, FIGS. 1-8 show a semiconductor device at various stages of manufacture, in accordance with one or more example embodiments. The two-dimensional views as shown may be implemented, for example, with a three-dimensional device having three or more sidewalls generally opposing one another and along which respective contacts can be made. Accordingly, while the two-dimensional figures show two opposing sidewalls, three or more such sidewalls may be implemented with a semiconductor material therebetween. Moreover, multiple contacts can be made in this regard, such as to three or four contacts at an upper surface brought along a sidewall or lower surface of a device (e.g., as shown in FIGS. 9 and 10).

Beginning with FIG. 1, a semiconductor wafer 100 has opposing surfaces 102 and 104, and respective (different) doped regions of opposing polarity including n-doped region 110 and p-doped region 120. These respective doped regions are referenced and indicated with respective doping types by way of example, with the understanding that the doping polarity may be reversed and/or that other positioning characteristics of the regions may be altered. Each of the n-doped and p-doped regions 110 and 120 is respectively in electrical contact with first and second contacts 112 and 122.

Figure 2:
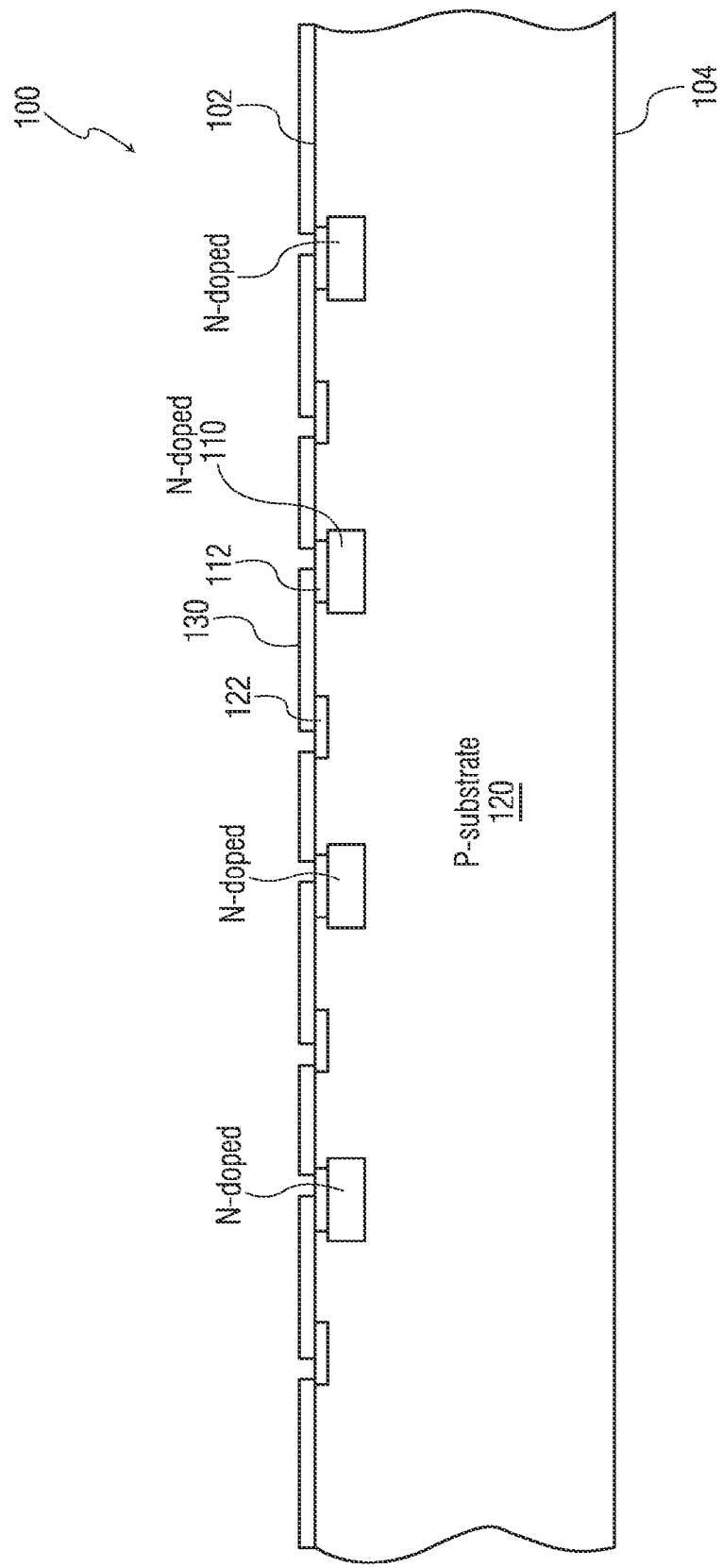
FIG. 2 shows a semiconductor wafer at an isolation stage of manufacture, in accordance with another example embodiment of the present invention.

In FIG. 2, an isolating/isolating layer 130 has been formed on a first (upper) surface of the wafer 100, and includes openings therein to expose the contacts (including 112 and 122). The layer 130 may, for example, be formed as a continuous layer and subsequently processed to form the openings that expose the contacts.

Figure 3:
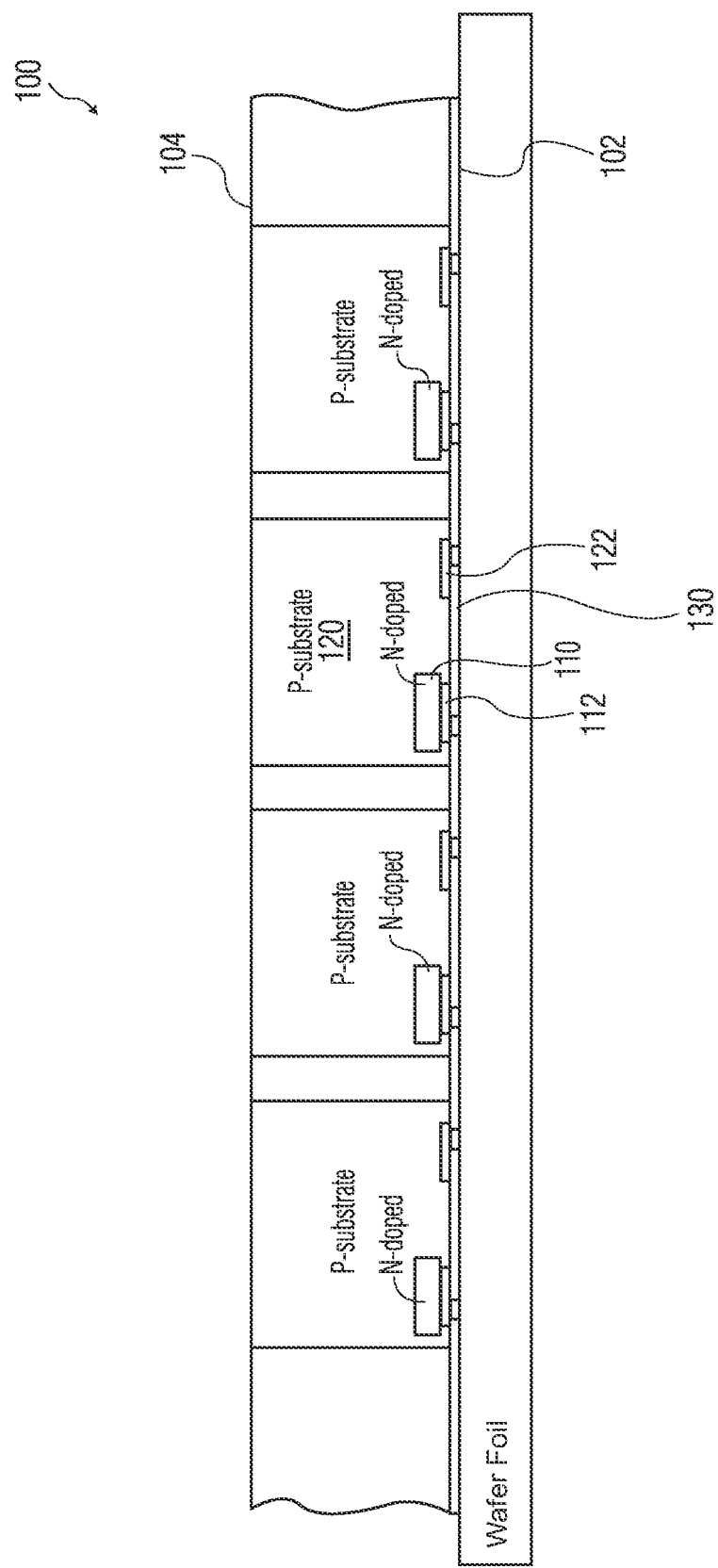
FIG. 3 shows a semiconductor wafer at a stage of manufacture in which the wafer is flipped on wafer foil, in accordance with another example embodiment of the present invention.
Figure 4:
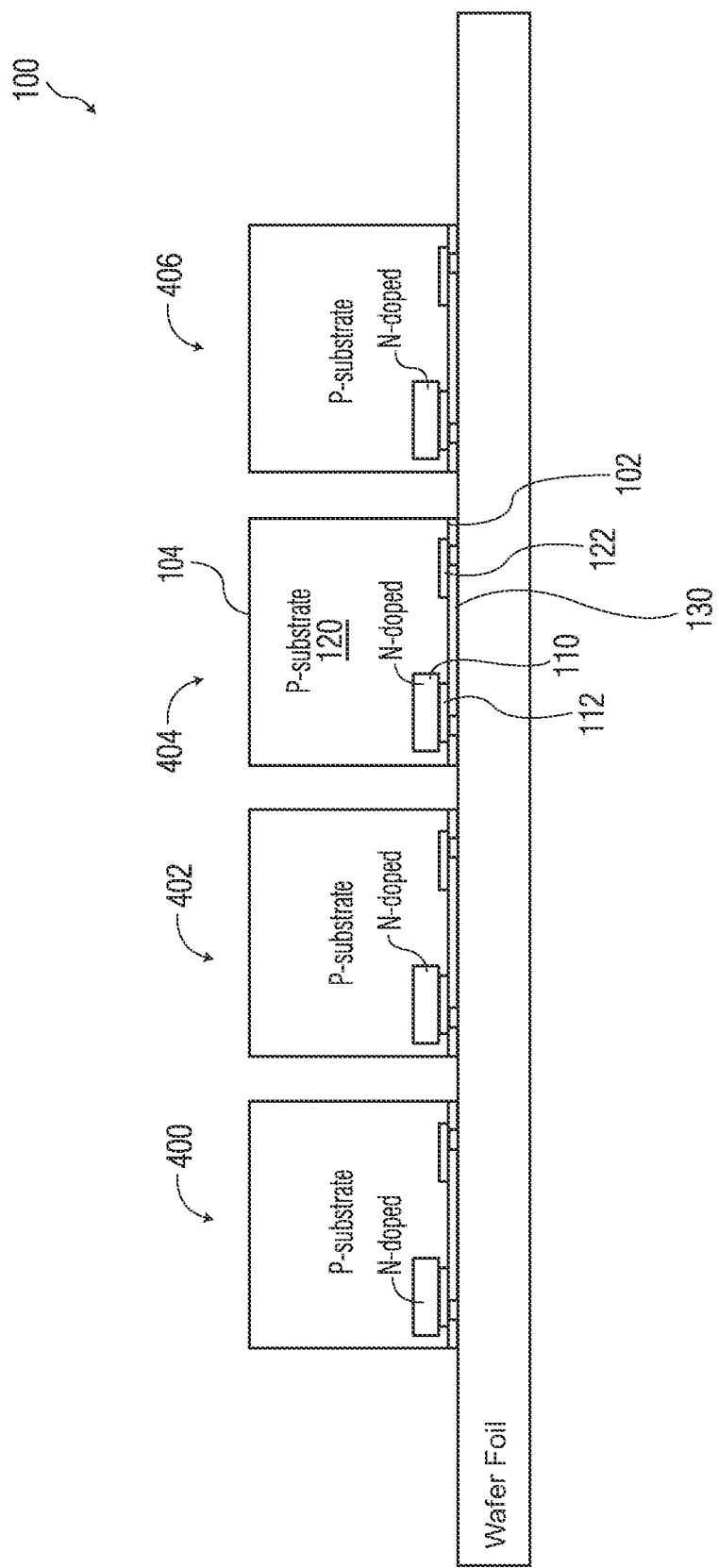
FIG. 4 shows a semiconductor wafer at a stage of manufacture involving a singulating step, in accordance with another example embodiment of the present invention.
Figure 5:
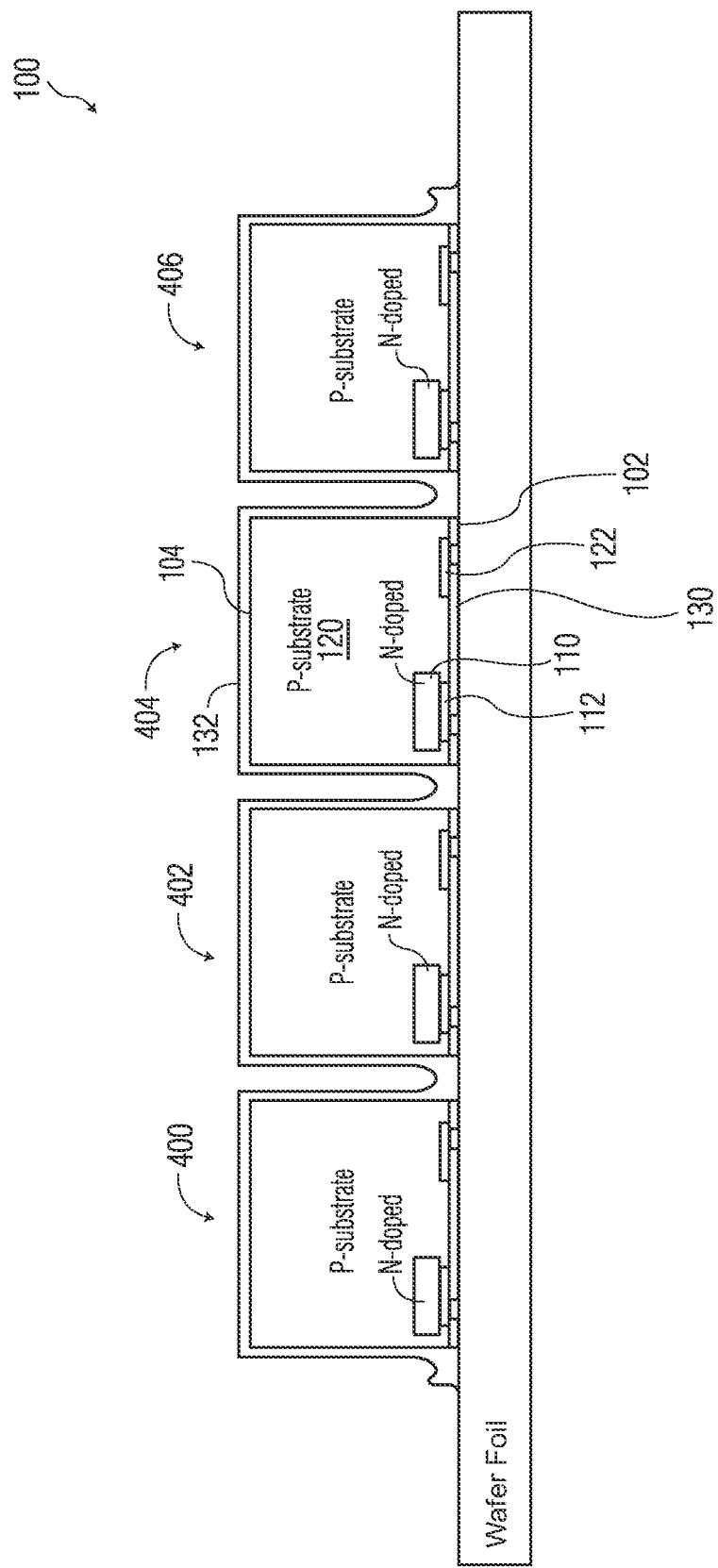
FIG. 5 shows a semiconductor device at a stage of manufacture involving the application of an isolating material, in accordance with another example embodiment of the present invention.
Figure 6:
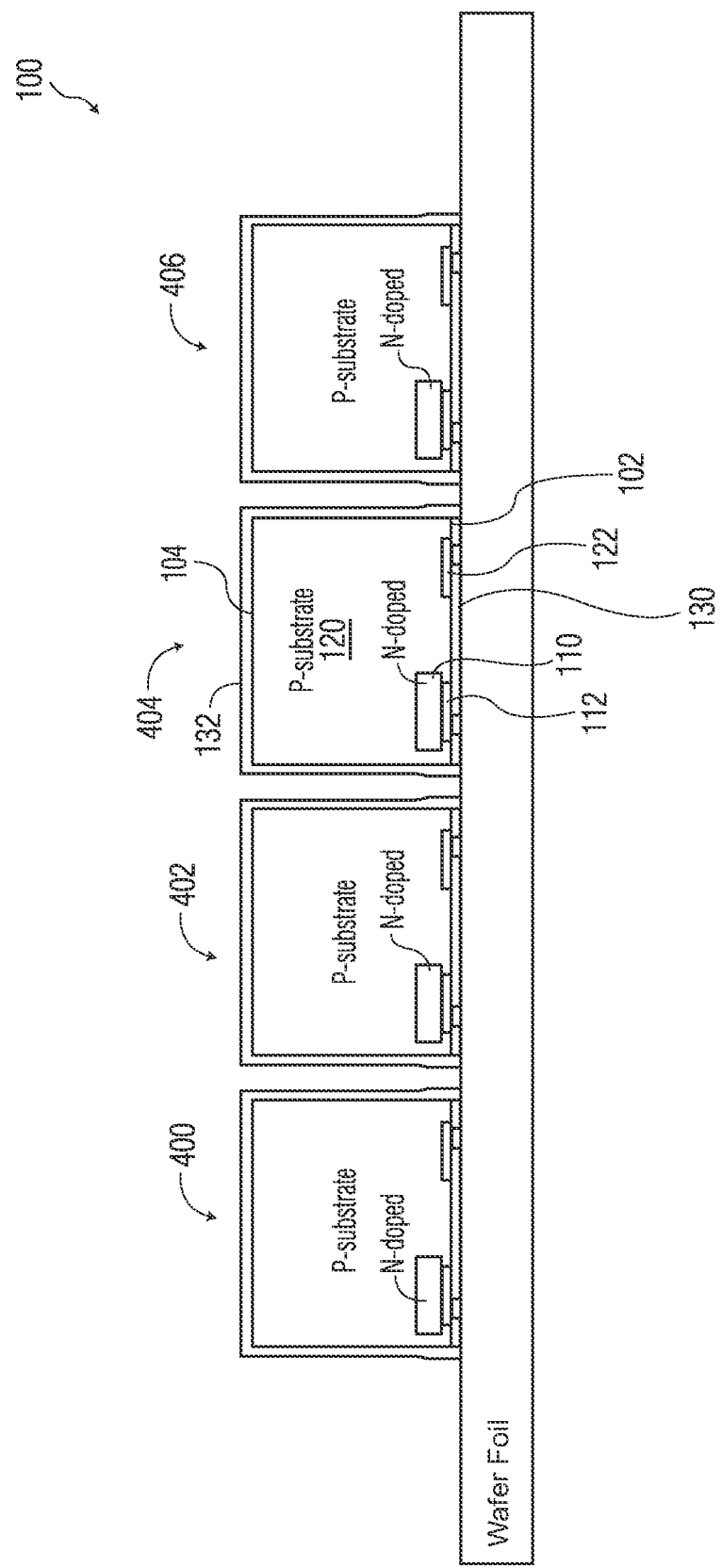
FIG. 6 shows a semiconductor device at a stage of manufacture involving the separation of components, in accordance with another example embodiment of the present invention.
Figure 7:
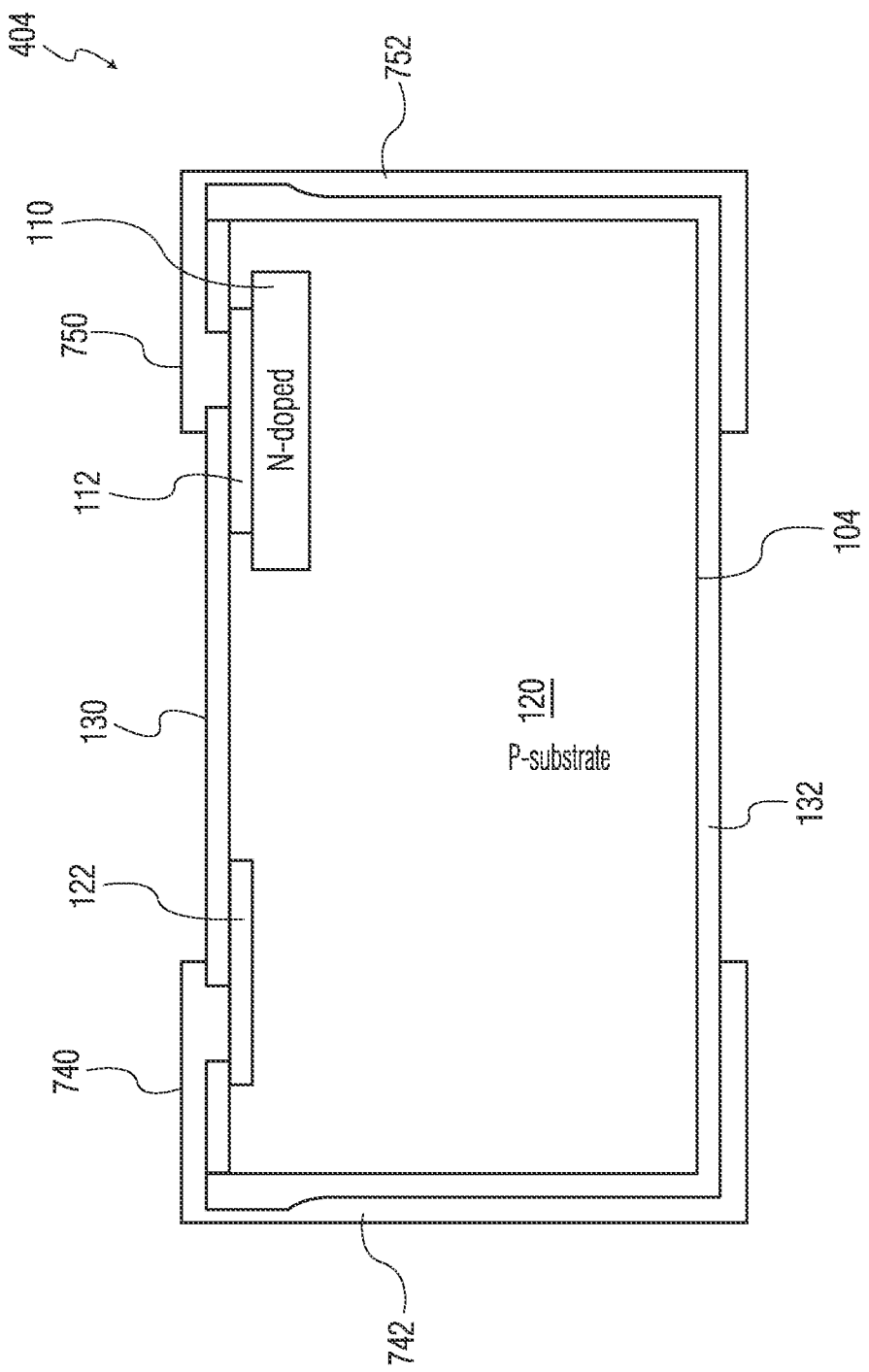
FIG. 7 shows a semiconductor device at a stage of manufacture involving the application of a plating base, in accordance with another example embodiment of the present invention.

FIGS. 3-6 show an example process in which the wafer 100 is separated to form respective devices as shown in FIG. 7. Referring to FIG. 3, the wafer 100 has been flipped onto a wafer foil or other material, after which respective portions of the wafer are removed as shown in FIG. 4. The wafer removal may be effected, for example, by sawing or other approaches, to singulate respective devices including devices 400, 402, 404 and 406. In FIG. 5, an isolating material 132 is formed on three surfaces of each device as shown, and in FIG. 6, another separation (e.g., sawing) step is carried out to separate the isolating material and again separate the devices 400, 402, 404 and 406.

After the devices have been separated, conductive plates 740 and 750 (e.g., electrodes) are respectively formed in contact with the contacts 112 and 122, and on portions of the insulation material 130 as shown in FIG. 7. The conductive plates 740 and 750 are each on portions of the isolating material 130 that are on the opposing upper and lower (first and second) surfaces 102 and 104. Conductive plate 740 is also on a portion of the isolating material 130 on a first sidewall 742, and conductive plate 750 is also on a portion of the isolating material 130 on a second sidewall 752.

Figure 8:
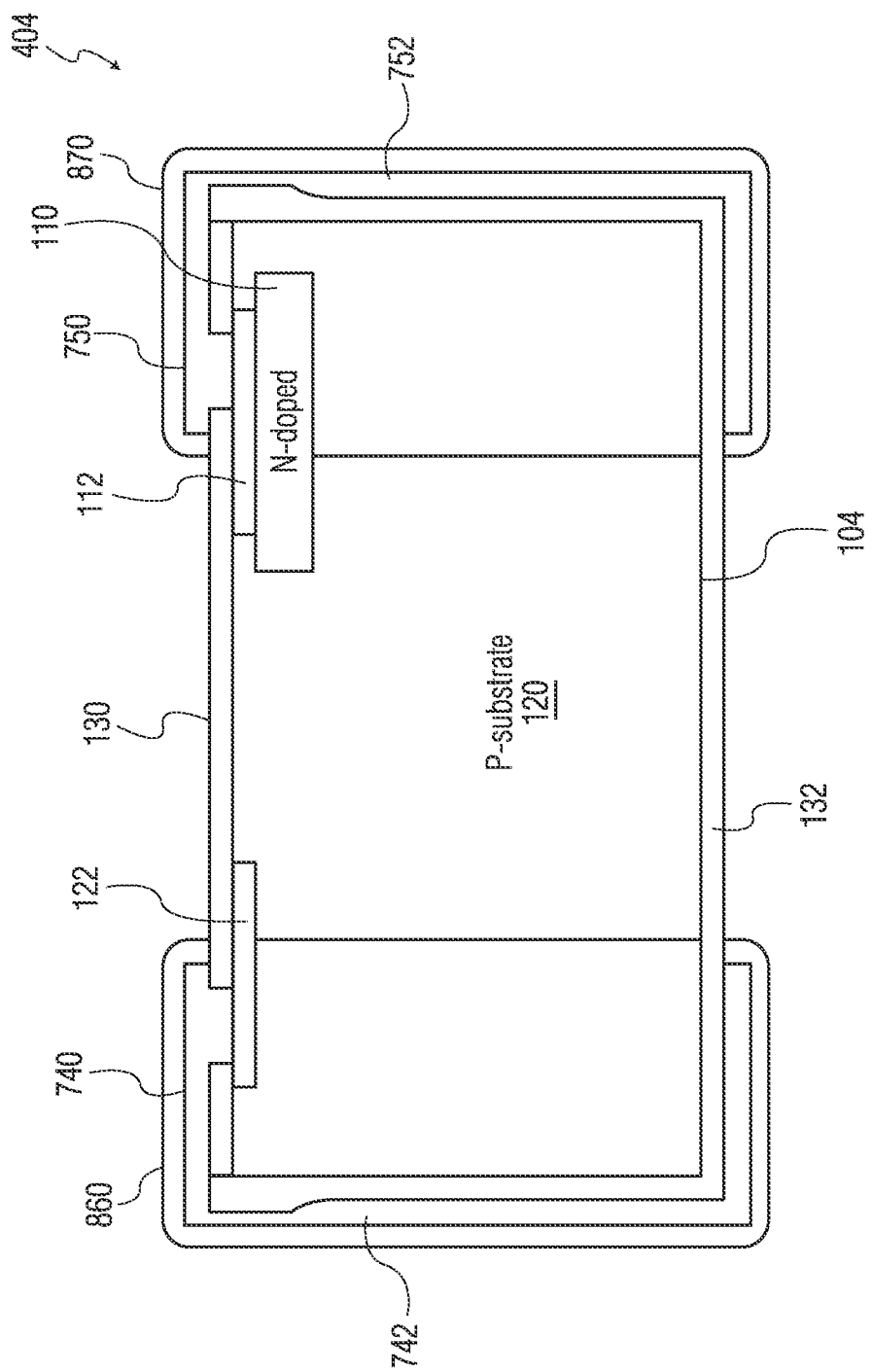
FIG. 8 shows a semiconductor device at a stage of manufacture involving the formation of a solderable surface, in accordance with another example embodiment of the present invention.

In FIG. 8, solderable layers 860 and 870 are respectively on portions of the conductive plates 740 and 750, and facilitate connection of the conductive plates to electrical connectors. The solderable layers 860 and 870 may, for example, include Sn, NiSn (e.g., with Ni operating as a connecting/barrier layer), or other solderable materials that facilitate a soldered heat-based connection between the conductive plates and electrical connectors. In certain implementations, the solderable layers 860 and 870 are replaced with a metal stack (e.g., with Pd on top), and mounted with a conductive glue when coupling the device with other circuits.

Accordingly, connection can be made to contact 112 via a connector at the sidewall 752 or on edge portions of the opposing surfaces 102 and 104 at the sidewall 752. Similarly, connection can be made to contact 122 via a connector at the sidewall 742 or on edge portions of the opposing surfaces 102 and 104 at the sidewall 742.

FIG. 9 shows several views of a semiconductor device 900 having multiple I/O contacts, together with an example corresponding printed circuit board layout, in accordance with another example embodiment of the present invention. The device 900 may, for example, be implemented using a device similar to that shown in FIG. 8 and/or manufactured in accordance therewith, and having an additional contact as may be implemented, for example, as part of a transistor device with source, drain and gate electrodes, or as a double diode. Top view 910 shows a planar device with three contact windows 912, 914 and 916. Top/bottom view 920 shows corresponding contact regions 922, 924 and 926 as may be implemented using conductive plates and solderable material such as 750 and 870 as respectively shown in FIGS. 7 and 8. Top view 930 shows a vertically-arranged device with respective contact windows 932 and 934 as top connections and 936 and 938 (shown in dashed lines) as bottom contacts. View 940 shows a device and printed circuit board layout, with contact portions 942, 944 and 946 on a printed circuit board for making contact to the device (e.g., for contacting 912, 914 and 916). The respective shapes and locations of the contact windows may change to suit various applications.

FIG. 10 shows several views of a semiconductor device 1000 having four I/O contacts, together with an example corresponding printed circuit board layout, in accordance with another example embodiment of the present invention. The device 1000 may, for example, be implemented using a device similar to that shown in FIG. 8 and/or manufactured in accordance therewith, and having additional contacts. Top view 1010 shows a planar device with four contact windows 1012, 1014, 1016 and 1018. Top/bottom view 1020 shows corresponding contact regions 1022, 1024, 1026 and 1028 as may be implemented using conductive plates and solderable material such as 750 and 870 as respectively shown in FIGS. 7 and 8. Top view 1030 shows a vertical device with top contact windows 1032 and 1034, and bottom contact windows 1036 and 1038 shown in dashed lines. View 1040 shows a device and printed circuit board layout, with contact portions 1042, 1044, 1046 and 1048 on a printed circuit board for making contact to the device (e.g., for contacting 1012, 1014, 1016 and 1018).

Figure 11:
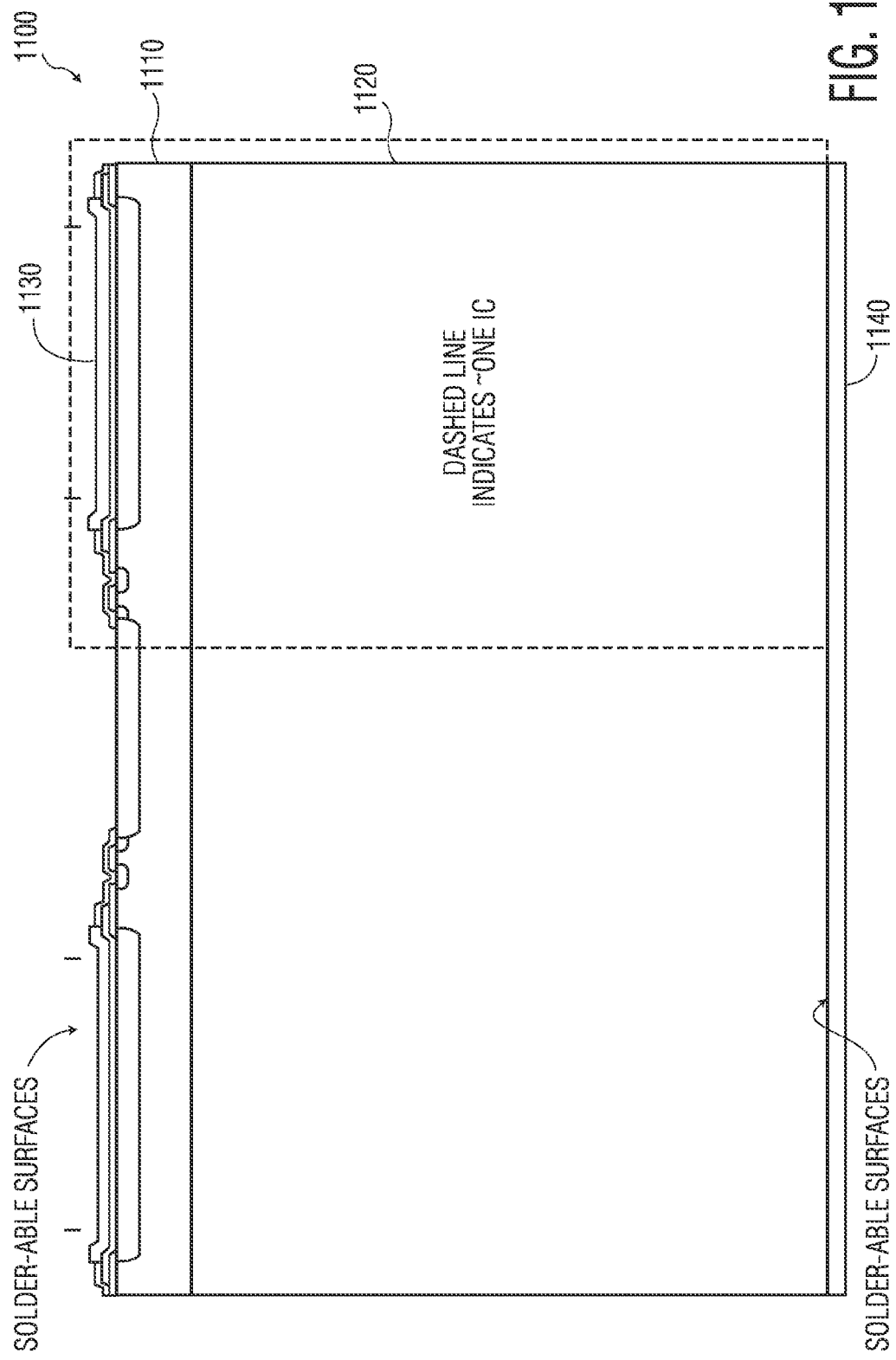
FIG. 11 shows another semiconductor device, in accordance with another example embodiment of the present invention.
Figure 12:
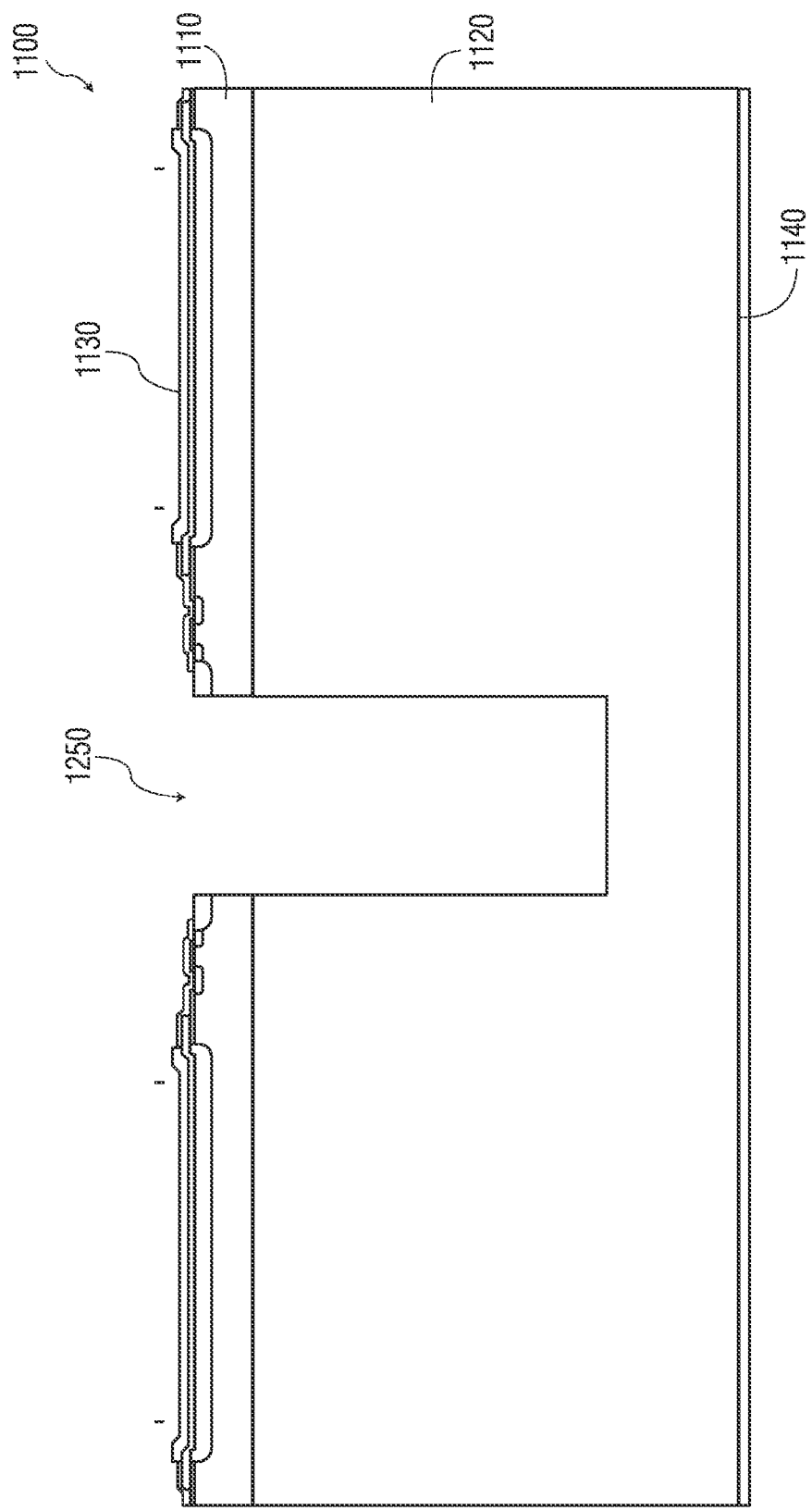
FIG. 12 shows a semiconductor device at a stage of manufacture involving a sawing step, in accordance with another example embodiment of the present invention.

FIG. 11 shows a semiconductor device 1100 at a stage of manufacture, in accordance with another example embodiment of the present invention. The device 1100 includes vertically-arranged doped regions 1110 and 1120 of opposite polarity, and upper and lower surfaces 1130 and 1140 for contacting the respective doped regions. In FIG. 12, the device 1100 has been sawed (or otherwise separated) with an opening 1250 formed as shown. In some implementations, the device 1100 is completely separated, rather than partially as shown in FIG. 12.

Figure 13:
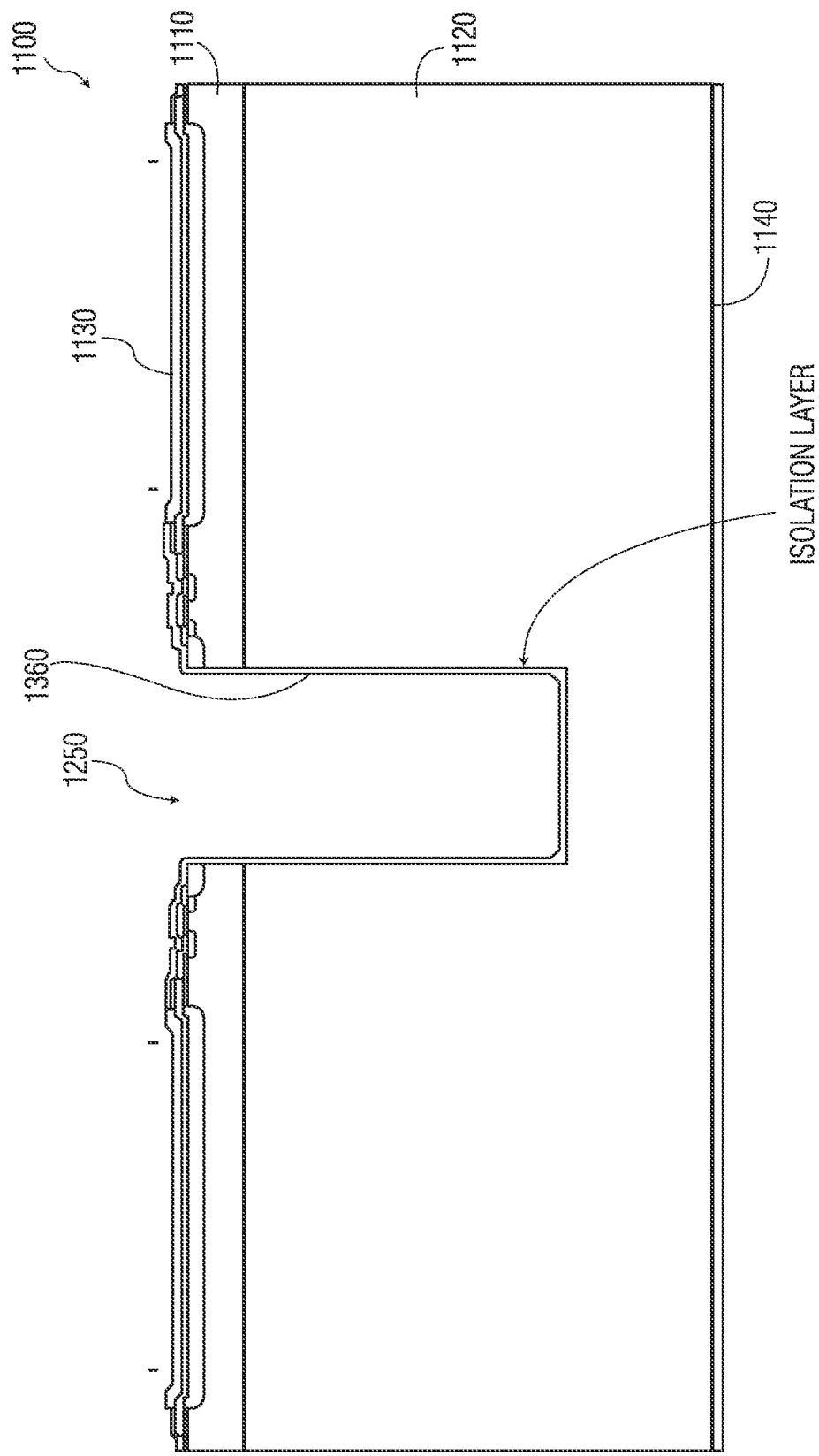
FIG. 13 shows a semiconductor device at a stage of manufacture involving the application of an isolation layer, in accordance with another example embodiment of the present invention.
Figure 14:
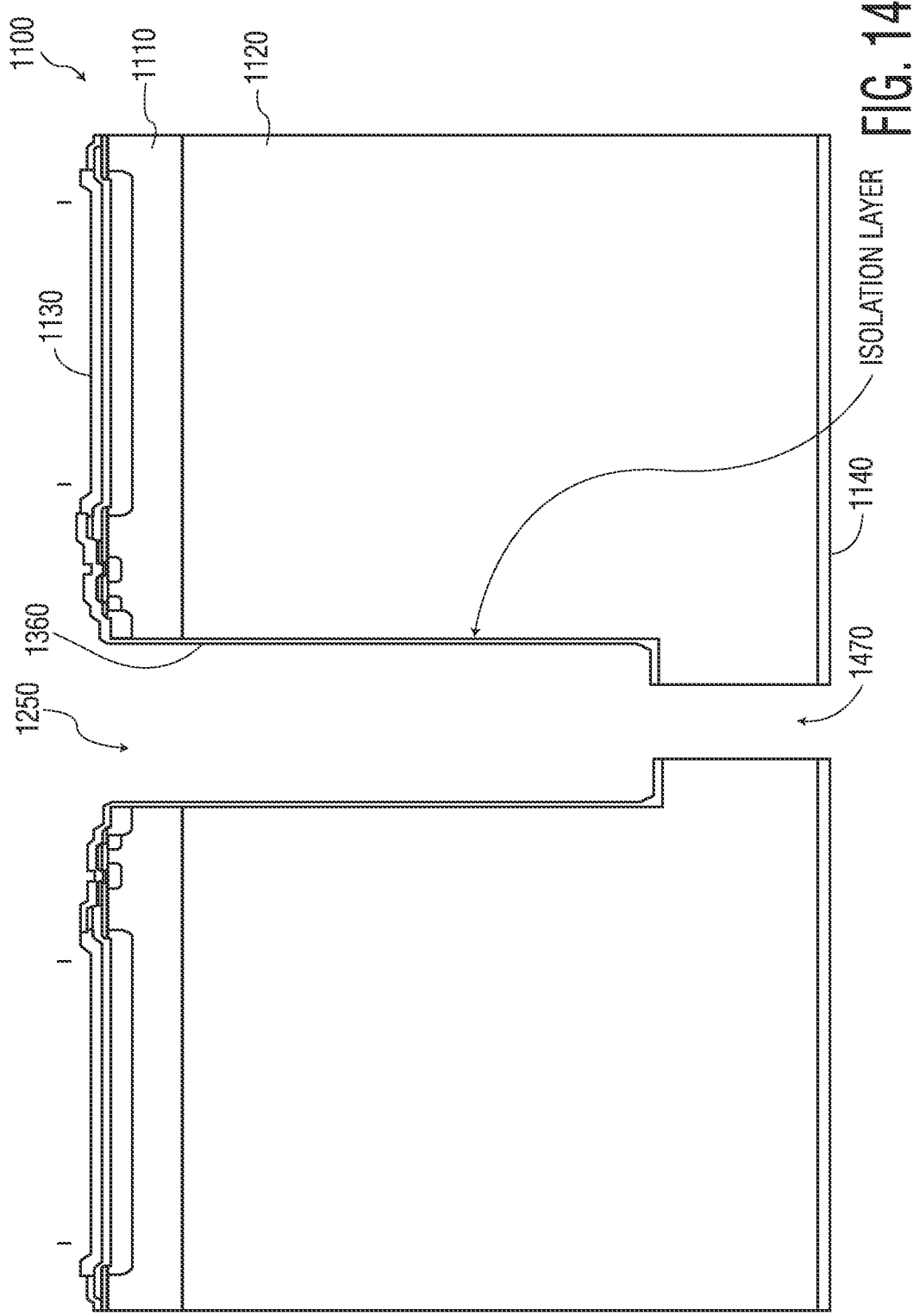
FIG. 14 shows a semiconductor device at a stage of manufacture involving another sawing step, in accordance with another example embodiment of the present invention.

At FIG. 13, an isolating layer 1360 has been formed on an upper surface and sidewalls of the device 1100, extending into the sawed/separated opening 1250. At FIG. 14, a further sawing/separating step has been carried out to completely separate the device 1100, via opening 1470. This further sawing/separating step is not necessarily carried out, if the step in FIG. 12 is made through the wafer. However, by partially separating the device, the isolating layer 1360 can be limited from covering a lower portion of sidewalls of the device 1100 (i.e., the opposing vertical walls of the device on which the isolation layer lies, and further below the isolation layer exhibiting a step at opening 1470).

Figure 15:
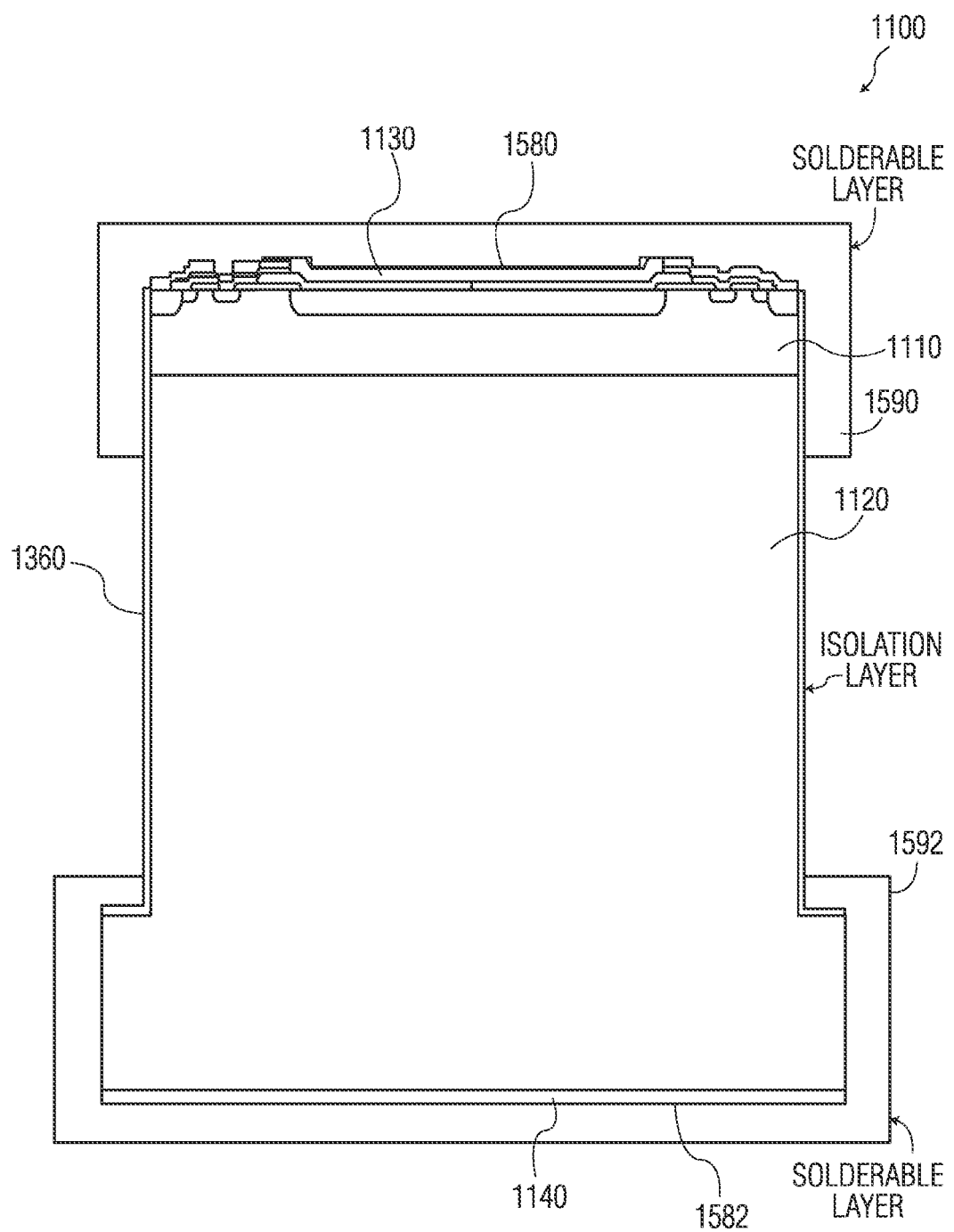
FIG. 15 shows a semiconductor device at a stage of manufacture involving the application of a plating base and solderable layer, in accordance with another example embodiment of the present invention.

At FIG. 15, contact plates 1580 and 1582 have been formed on upper and lower surfaces of the device 1100. Solderable material layers 1590 and 1592 have been formed on the contact plates 1580 and 1582. The contact plate 1580 and solderable material layer 1590 accordingly provide contact to an upper contact for doped layer 1110, and the contact plate 1582 and solderable material layer 1592 provide contact to the doped layer 1120. The isolating layer 1360 insulates the contact plates 1580 and 1582 from one another, and from the adjacent regions of the device 1100 to which contact is not made. Accordingly, a variety of approaches may be used to form and implement the device 1100 and respective portions therein as shown.

Based upon the above discussion and illustrations, those skilled in the art will readily recognize that various modifications and changes may be made to the present invention without strictly following the exemplary embodiments and applications illustrated and described herein. For example, different placement of I/O contacts can be implemented using approaches as discussed herein, and a variety of different circuit types and package types can be manufactured consistent herewith (e.g., as in FIGS. 10 and 11) and including, for example, discrete transistor-based circuits (e.g., MOS, bipolar), diodes, logic circuits (e.g., AND, OR, NOR) and more complex circuits (e.g., microcontrollers, CPUs). Such modifications do not depart from the true spirit and scope of the present invention, including that set forth in the following claims.

What is claimed is:

1. For use in a connecting to an external package having a plurality of semiconductor devices in which same-surface connections to the devices are spatially restricted, an apparatus comprising:
    a semiconductor device having first and second opposing surfaces and first and second opposing sidewalls connecting the opposing surfaces, the semiconductor device including first and second different regions and first and second conductive contacts respectively in contact with the first and second different regions, the contacts having access via different surfaces;
    a first electrode in contact with the first contact and extending along the first surface and along at least one of the sidewalls;
    a second electrode in contact with the second contact and extending along at least one of the surfaces and one of the sidewalls that is different than the sidewall along which the first electrode extends; and
    isolating material having an opening therein that exposes the first conductive contact at the first surface the first electrode extending through the opening to contact the first conductive contact, the isolating material being configured and arranged to electrically insulate the first and second electrodes from one another and from the first surface and the opposing sidewalls; and
        wherein the second contact is in the second surface and the second electrode is in direct contact with the second surface, the first and second electrodes respectively providing contact to the first and second different regions via external connectors adjacent the first and second surfaces.

2. The apparatus of claim 1, wherein the first and second electrodes are both on portions of the isolating material on the sidewalls and are electrically insulated from one another and from the different regions by the isolating material.

3. For use in connecting to an external package having a plurality of semiconductor devices in which external connections to the devices are spatially restricted, an apparatus comprising;
    a semiconductor device having first and second opposing surfaces and first and second opposing sidewalls connecting the opposing surfaces, the semiconductor device including first and second different regions and first and second conductive contacts respectively in contact with the first and second different regions, the contacts having access via different surfaces;
    first and second electrodes respectively in contact with the first and second contacts, each electrode extending along at least one surface or sidewall of the semiconductor device that is different than a surface or sidewall along which the other one of the electrodes extends;
    isolating material having an opening therein that exposes the first and second conductive contacts at the first surface, the first and second electrodes extending through the first and second openings to contact the first and second conductive contacts, the isolating material being configured and arranged to electrically insulate the first and second electrodes from one another and from portions of the first and second different regions; and
        wherein the first and second electrodes provide electrical connections to the respective first and second contacts via external connectors adjacent different surfaces or sidewalls of the semiconductor device, and
    the isolating material electrically isolates the first and second electrodes respectively from all portions of the semiconductor device except the contact that the electrode physically contacts.

4. The apparatus of claim 3, wherein
    the isolating material includes isolating material on the second surface, and
    the first electrode is also on a portion of the isolating material on the second surface.

5. The apparatus of claim 4, further including a first solder layer on the first electrode and configured and arranged to electrically connect a first electrical conductor in contact with the first solder layer with a portion of the first electrode that is on the isolating material on the second surface, therein connecting the first contact at the first surface with the external conductor at the second surface.

6. The apparatus of claim 4, further including first and second solder layers respectively on the first and second electrodes and configured and arranged to
electrically connect a first electrical conductor in contact with the first solder layer with a portion of the first electrode adjacent the second surface, therein connecting the first contact at the first surface with the first external conductor at the second surface, and
electrically connect a second electrical conductor in contact with the second solder layer with a portion of the second electrode that is on the isolating material on the second sidewall, therein connecting the second contact at the first surface with the second external conductor at the second sidewall.

7. The apparatus of claim 3, wherein
the isolating material includes isolating material on the second surface, and
the first and second electrodes are also respectively on a portion of the isolating material on the second surface and electrically separated from one another by the isolating material on the second surface.

8. The apparatus of claim 7, further including first and second solder layers respectively on the first and second electrodes, and configured and arranged to respectively electrically connect first and second external conductors with portions of the first and second electrodes on the second surface, therein respectively connecting the first and second contacts at the first surface with the first and second external conductors at the second surface.

9. The apparatus of claim 3, further including first and second solder layers configured and arranged to respectively electrically connect first and second external conductors to portions of the first and second electrodes respectively on portions of the isolating material on the first and second sidewalls, therein connecting the first and second contacts at the first surface with the first and second external conductors at the first and second sidewalls.

10. A method for manufacturing a semiconductor device for use in connecting to an external package having a plurality of semiconductor devices in which external connections to the devices are spatially restricted, the method comprising:
forming isolating material on sidewalls and on a first surface of a semiconductor device, the semiconductor device also having a second surface opposing the first surface and first and second opposing sidewalls extending between the opposing surfaces, the isolating material haying an opening that exposes a first conductive contact in the first surface and in contact with a first different region in the semiconductor device;
forming a first electrode on portions of the isolating material that are on the first surface and on at least one of the sidewalls, and extending through the opening and in contact with the first contact; and
forming a second electrode in electrical contact with a second different region via a second contact, extending along one of the sidewalls that is different than a sidewall along which the first electrode extends, therein providing access to the first and second contacts via different external connectors adjacent different sidewalls or surfaces; and
wherein
forming the isolating material includes
forming a first isolating material on the first surface of a semiconductor wafer and having an opening therein exposing the second contact,
removing a portion of the isolating material and the semiconductor wafer to form the semiconductor device having exposed sidewalls,
inverting the semiconductor device to present the sidewalls and the second surface, and
forming a second isolating material on the exposed sidewalls and on the second surface, the second isolating material contacting the first isolating material on the first surface,
forming the second electrode includes forming the second electrode to contact the second contact in the first surface, via the opening in the first isolating material, and extending along the first isolating material on the first surface, and along the second isolating material on the second sidewall and on the second surface.

11. A method for manufacturing a semiconductor device for use in connecting to an external package having a plurality of semiconductor devices in which external connections to the devices are spatially restricted, the method comprising:
forming isolating material on sidewalls and on a first surface of a semiconductor device, the semiconductor device also having a second surface opposing the first surface and first and second opposing sidewalls extending between the opposing surfaces, the isolating material haying an opening that exposes a first conductive contact in the first surface and in contact with a first different region in the semiconductor device;
forming a first electrode on portions of the isolating material that are on the first surface and on at least one of the sidewalls, and extending through the opening and in contact with the first contact; and
forming a second electrode in electrical contact with a second different region via a second contact, extending along one of the sidewalls that is different than a sidewall along which the first electrode extends, therein providing access to the first and second contacts via different external connectors adjacent different sidewalls or surfaces; and
wherein forming the second electrode includes forming the second electrode in direct contact with the second surface, the second contact being in the second surface.

12. A method for manufacturing a semiconductor device for use in connecting to an external package having a plurality of semiconductor devices in which external connections to the devices are spatially restricted the method comprising:
forming isolating material on sidewalls and on a first surface of a semiconductor device, the semiconductor device also having a second surface opposing the first surface and first and second opposing sidewalls extending between the opposing surfaces, the isolating material haying an opening that exposes a first conductive contact in the first surface and in contact with a first different region in the semiconductor device;
forming a first electrode on portions of the isolating material that are on the first surface and on at least one of the sidewalls, and extending through the opening and in contact with the first contact; and
forming a second electrode in electrical contact with a second different region via a second contact, extending along one of the sidewalls that is different than a sidewall along which the first electrode extends, therein providing access to the first and second contacts via different external connectors adjacent different sidewalls or surfaces;
doping the device to form the first and second different regions, and forming the first and second contacts respectively in contact with the first and second different regions.

13. The method of claim 12, wherein forming the second electrode includes forming the second electrode to contact the second contact in the first surface, via another opening in the isolating material on the first surface.

14. The method of claim 13, wherein
forming the isolating material includes forming the isolating material on the second surface, and
forming a second electrode includes forming the second electrode extending along the isolating material on the first surface, the isolating material on the second sidewall and the isolating material on the second surface.

15. The method of claim 12, further including
forming first and second solder layers respectively on the first and second electrodes, and
heating the solder layers to liquefy at least a portion of the solder layers, contacting a liquefied portion of each of the first and second solder layers respectively to first and second contacts, and solidifying the liquefied portions to
electrically connect a first electrical conductor in contact with the first solder layer with a portion of the first electrode that is on the isolating material on the second surface, therein connecting the first contact at the first surface with the first external conductor at the second surface, and
electrically connect a second electrical conductor in contact with the second solder layer with a portion of the second electrode that is on the isolating material on the second sidewall, therein connecting the second contact at the first surface with the second external conductor at the second sidewall.

* * * * *